(12) United States Patent
Kuroyanagi

(10) Patent No.: US 10,090,825 B2
(45) Date of Patent: Oct. 2, 2018

(54) ACOUSTIC WAVE DEVICE

(71) Applicant: TAIYO YUDEN CO., LTD., Tokyo (JP)

(72) Inventor: Takuma Kuroyanagi, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 15/454,928

(22) Filed: Mar. 9, 2017

(65) Prior Publication Data

US 2017/0331455 A1 Nov. 16, 2017

(30) Foreign Application Priority Data

May 13, 2016 (JP) ................................. 2016-097206

(51) Int. Cl.
| | |
|---|---|
| *H03H 9/54* | (2006.01) |
| *H03H 9/64* | (2006.01) |
| *H01L 23/522* | (2006.01) |
| *H01L 23/528* | (2006.01) |
| *H01L 23/532* | (2006.01) |
| *H03H 9/145* | (2006.01) |

(52) U.S. Cl.
CPC ............. *H03H 9/64* (2013.01); *H01L 23/528* (2013.01); *H01L 23/5226* (2013.01); *H01L 23/53214* (2013.01); *H01L 23/53228* (2013.01); *H01L 23/53242* (2013.01); *H03H 9/14544* (2013.01); *H01L 2224/73257* (2013.01); *H01L 2224/97* (2013.01)

(58) Field of Classification Search
CPC .................................. H03H 9/54; H03H 9/64
USPC .................................. 333/187, 191, 193, 133
See application file for complete search history.

(56) References Cited

U.S. PATENT DOCUMENTS

| | | | | |
|---|---|---|---|---|
| 7,038,559 B2 * | 5/2006 | Ruby | ..................... | H03H 9/587 310/348 |
| 7,378,922 B2 * | 5/2008 | Kubo | ................. | B81C 1/00238 333/133 |
| 7,675,154 B2 * | 3/2010 | Hong | .................. | H03H 9/0547 257/685 |
| 8,283,835 B2 * | 10/2012 | Metzger | ................... | H03H 3/02 310/313 A |
| 8,294,535 B2 * | 10/2012 | Feiertag | ................ | H03H 9/059 333/187 |
| 8,723,621 B2 * | 5/2014 | Kidoh | .................. | H03H 9/1064 333/133 |
| 8,836,449 B2 * | 9/2014 | Pang | .................... | H03H 9/0571 333/187 |
| 9,634,641 B2 * | 4/2017 | Nishimura | ........... | H03H 9/0566 |

(Continued)

FOREIGN PATENT DOCUMENTS

| | | |
|---|---|---|
| JP | 2006-246112 A | 9/2006 |
| JP | 2008-546207 A | 12/2008 |

*Primary Examiner* — Dean Takaoka
(74) *Attorney, Agent, or Firm* — Chen Yoshimura LLP

(57) ABSTRACT

An acoustic wave device includes: a first substrate; a first acoustic wave filter located on a first surface of the first substrate; a pad that is located on the first surface and electrically separated from the first acoustic wave filter in the first surface; a ground pattern that is located on the first surface, and is located between the pad and the first acoustic wave filter in the first surface; and a second acoustic wave filter that is electrically connected to the pad, and at least partially overlaps with the first acoustic wave filter in plan view.

12 Claims, 21 Drawing Sheets

(56) References Cited

U.S. PATENT DOCUMENTS

2002/0109564 A1* 8/2002 Tsai .................. H03H 9/105
                                                  333/187
2009/0224851 A1   9/2009 Feiertag et al.

* cited by examiner

ACOUSTIC WAVE DEVICE

CROSS-REFERENCE TO RELATED APPLICATION

This application is based upon and claims the benefit of priority of the prior Japanese Patent Application No. 2016-097206, filed on May 13, 2016, the entire contents of which are incorporated herein by reference.

FIELD

A certain aspect of the present invention relates to an acoustic wave device.

BACKGROUND

As a packaging method of an acoustic wave device, there has been known a method that face-down mounts a chip including an acoustic wave element, and then covers the periphery of the chip with a sealing member. Japanese Patent Application Publication No. 2008-546207 (Patent Document 1) describes that two substrates each including an acoustic wave element formed on the surface thereof are bonded together through an interlayer so that the acoustic wave elements face each other across an air gap.

The acoustic wave device can be downsized by forming acoustic wave filters on different surfaces and staking them. However, the acoustic wave filters interfere with each other, and thereby, the isolation characteristic deteriorates.

SUMMARY OF THE INVENTION

According to an aspect of the present invention, there is provided an acoustic wave device including: a first substrate; a first acoustic wave filter located on a first surface of the first substrate; a pad that is located on the first surface and electrically separated from the first acoustic wave filter in the first surface; a ground pattern that is located on the first surface, and is located between the pad and the first acoustic wave filter in the first surface; and a second acoustic wave filter that is electrically connected to the pad, and at least partially overlaps with the first acoustic wave filter in plan view.

DETAILED DESCRIPTION

Hereinafter, a description will be given of embodiments of the present invention with reference to the accompanying drawings.

First Embodiment

Figure 1:
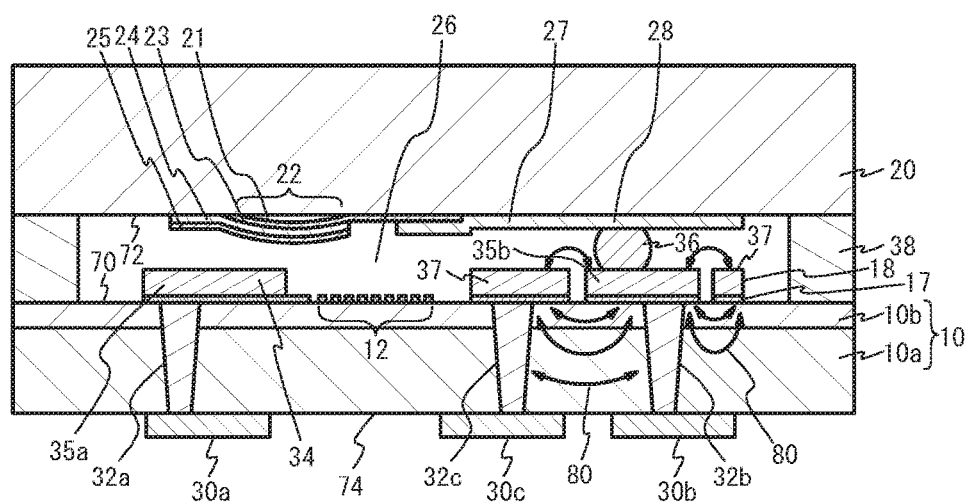
FIG. 1 is a cross-sectional view of an acoustic wave device in accordance with a first embodiment.

FIG. 1 is a cross-sectional view of an acoustic wave device in accordance with a first embodiment. As illustrated in FIG. 1, a substrate 20 is mounted on a substrate 10. The upper surface of the substrate 10 corresponds to a first surface 70, the lower surface of the substrate 20 corresponds to a second surface 72, and the lower surface of the substrate 10 corresponds to a third surface 74. The substrate 10 includes a support substrate 10a and a piezoelectric substrate 10b. The support substrate 10a is, for example, a sapphire substrate, a spinel substrate, an alumina substrate, or a silicon substrate. The piezoelectric substrate 10b is, for example, a lithium tantalate substrate or a lithium niobate substrate. The piezoelectric substrate 10b is bonded on the upper surface of the support substrate 10a. The bonded surface of the piezoelectric substrate 10b and the support substrate 10a is a plane surface and flat.

Located on the upper surface of the substrate 10 (i.e., on the first surface 70) are an acoustic wave resonator 12, wiring lines 34, pads 35a and 35b, and a ground pattern 37. The acoustic wave resonator 12 is formed of a metal layer 17, and the wiring lines 34, the pads 35a and 35b, and the ground pattern 37 are formed of the metal layer 17 and a metal layer 18 formed on the metal layer 17. The metal layer 17 is, for example, an aluminum layer or a copper layer. The metal layer 18 is, for example, a copper layer or a gold layer. Located on the lower surface of the substrate 10 (i.e., on the third surface 74) are terminals 30a through 30c. The terminals 30a through 30c are foot pads for connecting the acoustic wave resonators 12 and 22 to external devices. Via wirings 32a through 32c penetrating through the substrate 10 are provided. The via wirings 32a and 32b electrically connect the pads 35a and 35b to the terminals 30a and 30b, respectively. The via wiring 32c electrically connects the ground pattern 37 and the terminal 30c. The terminals 30a through 30c and the via wirings 32a through 32c are formed of, for example, a metal layer such as a copper layer, an aluminum layer, or a gold layer.

Located on the lower surface of the substrate 20 (i.e., on the second surface 72) are an acoustic wave resonator 22, a wiring line 27, and a pad 28. The substrate 20 is, for example, an insulating substrate such as a glass substrate or a semiconductor substrate such as a silicon substrate. The acoustic wave resonator 22 includes a lower electrode 23, a piezoelectric film 24, and an upper electrode 25. An air gap 21 is located between the lower electrode 23 and the substrate 20. The pad 28 is formed of, for example, a metal layer such as a copper layer, an aluminum layer, or a gold layer. A bump 36 and a ring-shaped sealing portion 38 are located between the substrates 10 and 20. The substrate 20 is flip-chip mounted (face-down mounted) on the substrate 10 through the bump 36. The bump 36 is, for example, a gold bump, a solder bump, or a copper bump. The ring-shaped sealing portion 38 is formed of a metal layer such as a gold layer, a copper layer, or a solder layer, or an insulating layer such as a resin layer. The acoustic wave resonators 12 and 22 face each other across an air gap 26. The air gap 26 is sealed by the ring-shaped sealing portion 38, and the substrates 10 and 20. The bump 36 is surrounded by the air gap 26.

The terminal 30a is electrically connected to the acoustic wave resonator 12 through the via wiring 32a, the pad 35a, and the wiring line 34. The terminal 30b is electrically connected to the acoustic wave resonator 22 through the via wiring 32b, the pad 35b, the bump 36, the pad 28, and the wiring line 27. The terminal 30b is not electrically connected to the acoustic wave resonator 12. The terminal 30c is electrically connected to the ground pattern 37 through the via wiring 32c. When a ground potential is supplied to the terminal 30c, the ground pattern 37 is grounded.

Figure 2A:
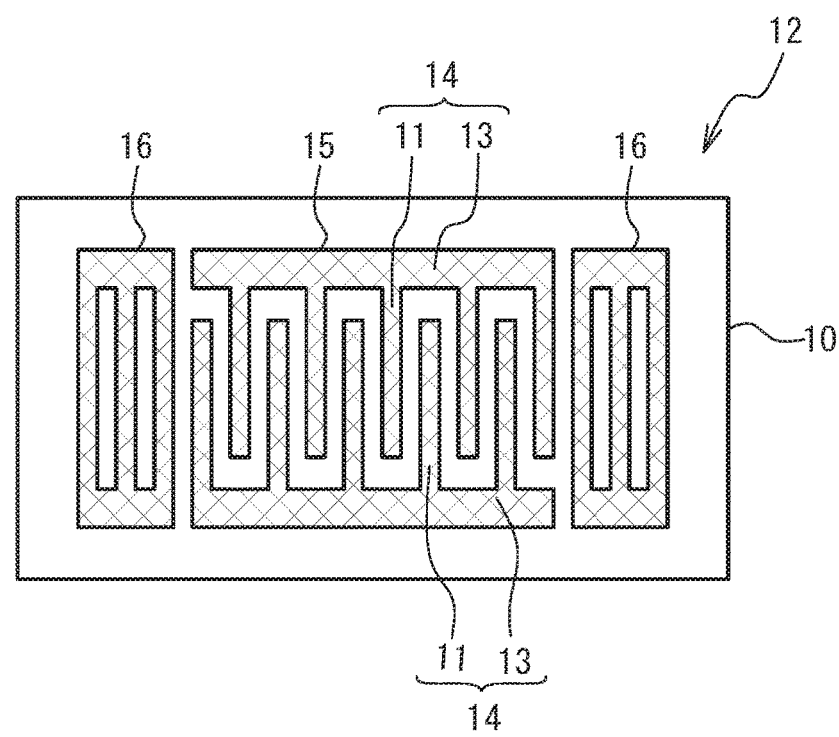
FIG. 2A is a plan view of an acoustic wave resonator 12.
Figure 2B:
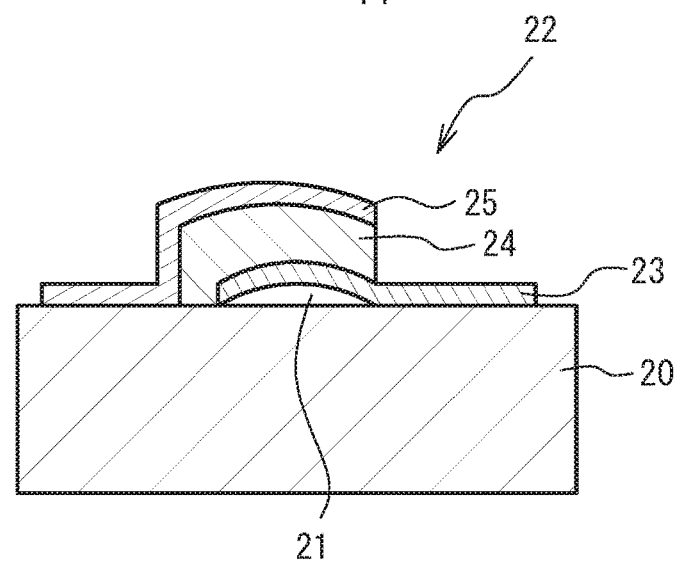
FIG. 2B is a cross-sectional view of an acoustic wave resonator 22.

FIG. 2A is a plan view of the acoustic wave resonator 12, and FIG. 2B is a cross-sectional view of the acoustic wave resonator 22. As illustrated in FIG. 2A, the acoustic wave resonator 12 is a surface acoustic wave resonator. An Interdigital Transducer (IDT) 15 and reflectors 16 are located on the substrate 10. The IDT 15 includes a pair of comb-shaped electrodes 14 facing each other. The comb-shaped electrode 14 includes electrode fingers 11 and a bus bar 13 to which the electrode fingers 11 are connected. The reflectors 16 are located at both sides of the IDT 15. The IDT 15 excites a surface acoustic wave on the piezoelectric substrate 10b. The IDT 15 and the reflectors 16 are formed of the metal layer 17 in FIG. 1. A protective film or a temperature compensation film made of an insulating material may be located on the metal layer 17.

As illustrated in FIG. 2B, the acoustic wave resonator 22 is a piezoelectric thin film resonator. The piezoelectric film 24 is located on the substrate 20. The lower electrode 23 and the upper electrode 25 are located so as to sandwich the piezoelectric film 24. The air gap 21 is formed between the lower electrode 23 and the substrate 20. The lower electrode 23 and the upper electrode 25 excites an acoustic wave in the thickness extension mode in the piezoelectric film 24. The lower electrode 23 and the upper electrode 25 are formed of a metal film such as, for example, a ruthenium film. The piezoelectric film 24 is, for example, an aluminum nitride film. The acoustic wave resonators 12 and 22 include electrodes exciting acoustic waves. Thus, the acoustic wave resonators 12 and 22 are covered with the air gap 26 so as not to restrain the acoustic waves.

Figure 3:
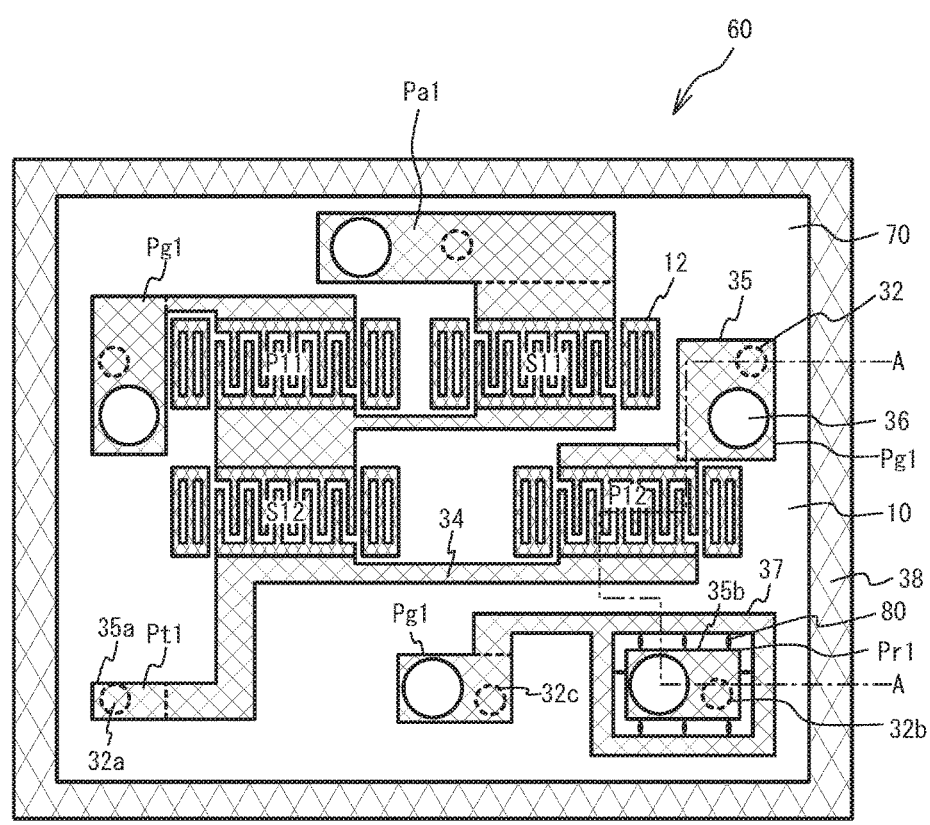
FIG. 3 is a plan view of the upper surface of a substrate 10 in the first embodiment.

FIG. 3 is a plan view of the upper surface of the substrate 10 in the first embodiment. FIG. 1 corresponds to a cross-sectional view taken along line A-A in FIG. 3. As illustrated in FIG. 3, located on the upper surface of the substrate 10 are a plurality of the acoustic wave resonators 12, the wiring lines 34, pads 35, and the ring-shaped sealing portion 38. The bumps 36 are located on the pads 35. Via wirings 32 connecting to the pads 35 are formed in the substrate 10. The pads 35 include a common pad Pa1, a transmit pad Pt1, a receive pad Pr1, and ground pads Pg1. The transmit pad Pt1 corresponds to the pad 35a in FIG. 1, and the receive pad Pr1 corresponds to the pad 35b in FIG. 1. A transmit filter 60 is a ladder-type filter, and includes series resonators S11 and S12 and parallel resonators P11 and P12 that are the acoustic wave resonators 12. The series resonators S11 and S12 are connected in series between the common pad Pa1 and the transmit pad Pt1 through the wiring lines 34. The parallel resonators P11 and P12 are connected in parallel between the common pad Pa1 and the transmit pad Pt1 through the wiring lines 34. The parallel resonators P11 and P12 are connected to the ground pads Pg1 through the wiring lines 34.

The ground pattern 37 is located on the upper surface of the substrate 10 so as to surround the receive pad Pr1. The ground pattern 37 is coupled to the ground pad Pg1. This structure connects the ground pattern 37 to a ground.

Figure 4:
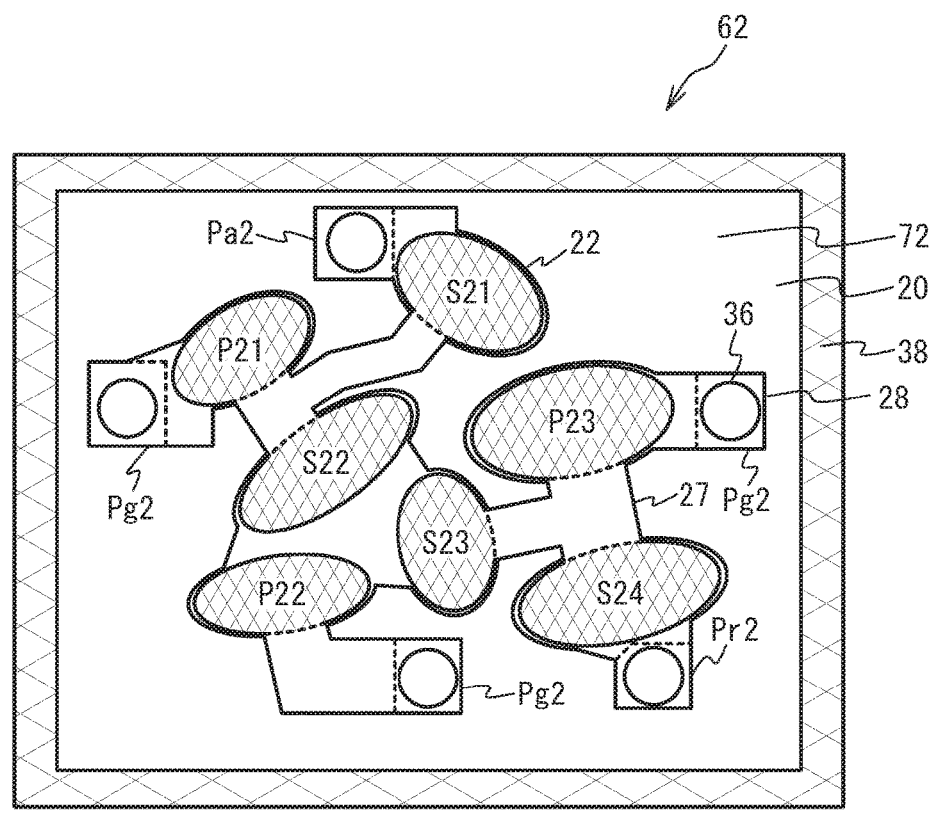
FIG. 4 is a plan view of the lower surface of a substrate 20 in the first embodiment.

FIG. 4 is a plan view of the lower surface of the substrate 20 in the first embodiment. To make the correspondence between FIG. 4 and FIG. 3 easier to understand, FIG. 4 is a plan view transparently illustrated from above the substrate 20. As illustrated in FIG. 4, located on the lower surface of the substrate 20 are a plurality of the acoustic wave resonators 22, the wiring lines 27, the pads 28, and the ring-shaped sealing portion 38. The bumps 36 are located on the pads 28. The pads 28 include a common pad Pa2, a receive pad Pr2, and ground pads Pg2. A receive filter 62 is a ladder-type filter, and includes series resonators S21 through S24 and parallel resonators P21 through P23 that are the acoustic wave resonators 22. The series resonators S21 through S24 are connected in series between the common pad Pa2 and the receive pad Pr2 through the wiring lines 27. The parallel resonators P21 through P23 are connected in parallel between the common pad Pa2 and the receive pad Pr2 through the wiring lines 27. The parallel resonators P21 through P23 are coupled to the ground pads Pg2 through the wiring lines 27.

Figure 5:
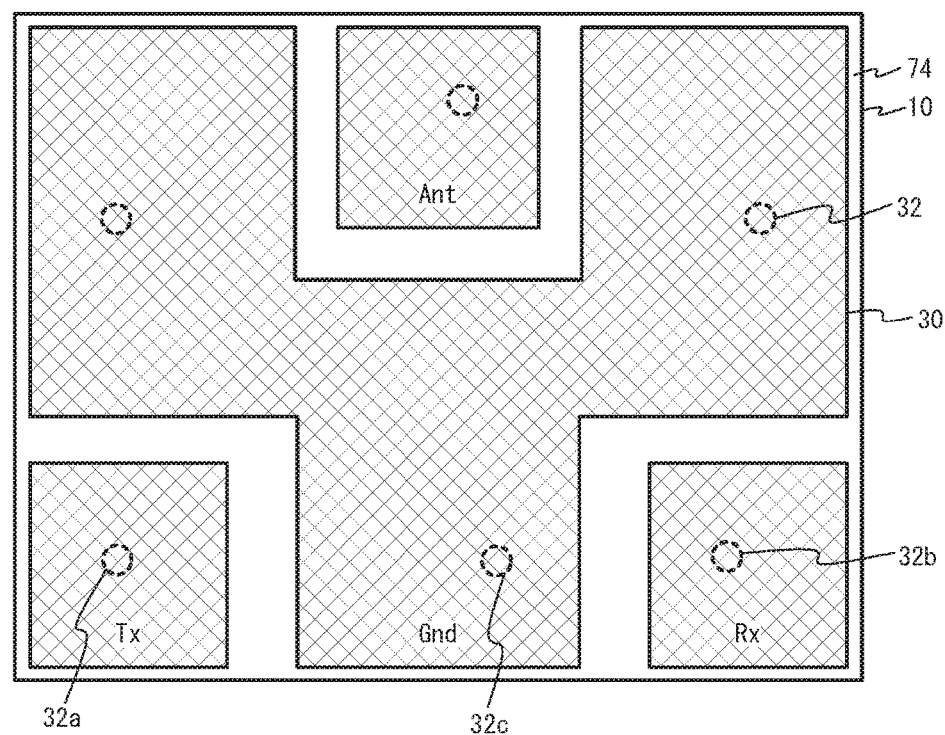
FIG. 5 is a plan view of the lower surface of the substrate 10 in the first embodiment.

FIG. 5 is a plan view of the lower surface of the substrate 10 in the first embodiment. To make the correspondence between FIG. 5 and FIG. 3 easier to understand, FIG. 5 is a plan view transparently illustrated from above the substrate 10. As illustrated in FIG. 5, terminals 30 are located on the lower surface of the substrate 10. The terminals 30 include a common terminal Ant, a transmit terminal Tx, a receive terminal Rx, and a ground terminal Gnd. As illustrated in FIG. 3 through FIG. 5, the common terminal Ant is electrically connected to the common pad Pa1 through the via wiring 32, and is further electrically connected to the common pad Pa2 through the bump 36. The transmit terminal Tx is electrically connected to the transmit pad Pt1 through the via wiring 32a. The receive terminal Rx is electrically connected to the receive pad Pr2 through the via wiring 32b, the receive pad Pr1, and the bump 36. The ground terminal Gnd is electrically connected to the ground pad Pg1 through the via wiring 32c, and is further electrically connected to the ground pad Pg2 through the bump 36.

As described above, the acoustic wave device of the first embodiment functions as a duplexer including: the transmit filter 60 connected between the common terminal Ant and the transmit terminal Tx; and the receive filter 62 connected between the common terminal Ant and the receive terminal Rx. The transmit filter 60 transmits signals in the transmit band to the common terminal Ant among high-frequency signals input from the transmit terminal Tx, and suppresses other signals. The receive filter 62 transmits signals in the receive band to the receive terminal Rx among high-frequency signals input from the common terminal Ant, and suppresses other signals.

Figure 6:
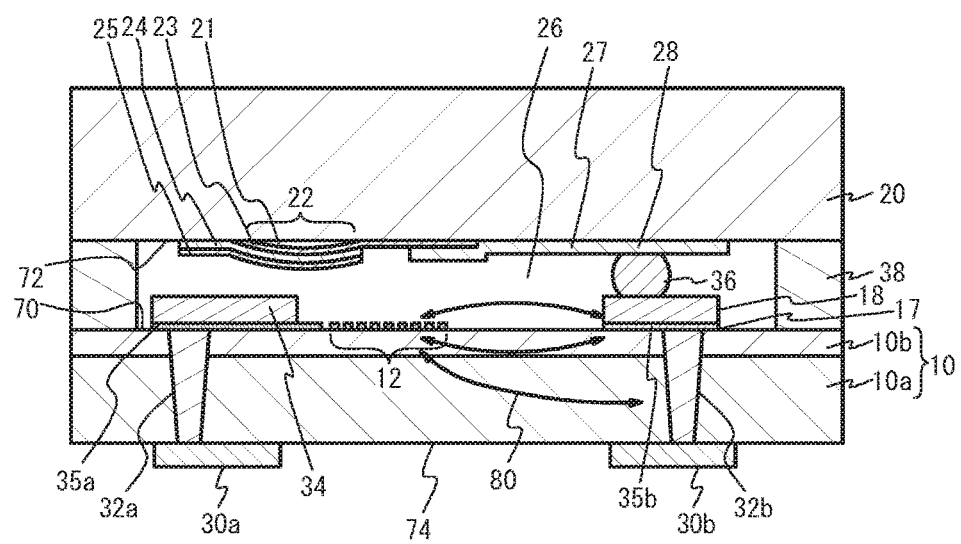
FIG. 6 is a cross-sectional view of an acoustic wave device in accordance with a first comparative example.
Figure 7:
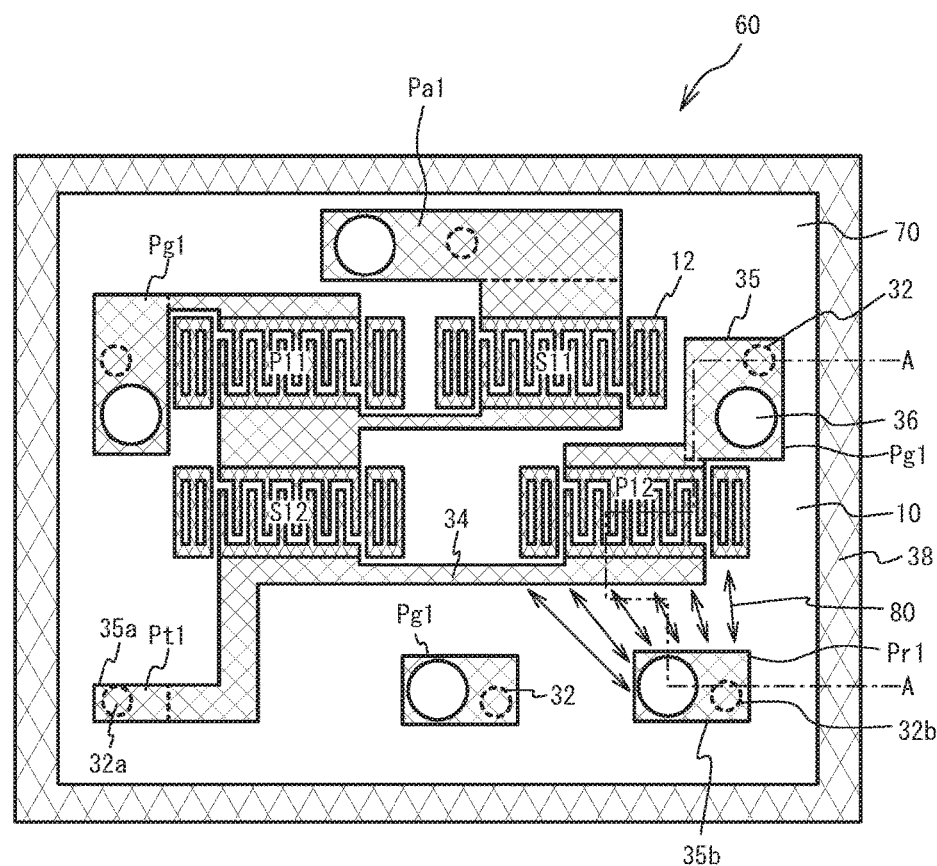
FIG. 7 is a plan view of the substrate 10 in the first comparative example.

FIG. 6 is a cross-sectional view of an acoustic wave device in accordance with a first comparative example. FIG. 7 is a plan view of the substrate 10 in the first comparative example. As illustrated in FIG. 6 and FIG. 7, a ground pattern is not formed on the first surface 70. Other structures are the same as those of the first embodiment, and the description thereof is omitted.

In the first comparative example and the first embodiment, the first surface 70 on which the transmit filter 60 is formed, the second surface 72 on which the receive filter 62 is formed, and the third surface 74 on which the terminals 30 are formed are stacked. The receive terminal Rx is electrically connected to the receive filter 62, but is not electrically connected to the transmit filter 60. However, when the first surface 70 is located between the second surface 72 and the third surface 74, the receive pad Pr1 is to be located on the first surface 70. The receive pad Pr1 is not electrically connected to the transmit filter 60 in the first surface 70. As indicated by arrows 80 in FIG. 6 and FIG. 7, the receive pad Pr1 and the transmit filter 60 are capacitively coupled. Since the air gap 26 has a relative permittivity of approximately 1 while the substrate 10 has a relative permittivity greater than 1, the capacitive coupling between the receive pad Pr1 and the transmit filter 60 is large. Accordingly, the transmit filter 60 and the receive pad Pr1 interfere with each other, and the isolation characteristic between the transmit filter 60 and the receive filter 62 deteriorates. For example, through the capacitive coupling, transmission signals leak to the receive pad Pr1.

As described above, as in the first comparative example, the substrate 20, which is one of the substrate 10 on which the transmit filter 60 is formed and the substrate 20 on which the receive filter 62 is formed, goes through above the substrate 10, which is the other of the substrate 10 and the substrate 20, and connects to an external terminal. At this time, unlike a case where the substrates 10 and 20 are mounted on a circuit board in the same direction, the inventor found that the isolation deteriorates because of the permittivity of the substrate 10 since the transmit filter 60 and the wiring line become close to each other when the substrate 20 goes through the substrate 10.

As illustrated in FIG. 1 and FIG. 3, in the first embodiment, the ground pattern 37 is located between the transmit filter 60 and the receive pad Pr1. This structure capacitively couples the receive pad Pr1 to the ground pattern 37 as indicated by the arrows 80. Thus, the interference between the transmit filter 60 and the receive pad Pr1 can be inhibited, and the isolation characteristic can be improved.

In the first embodiment, the transmit filter 60 (a first acoustic wave filter), the receive pad Pr1, and the ground pattern 37 are located on the first surface 70 of the substrate 10 (a first substrate). The transmit filter 60 and the receive pad Pr1 are electrically separated in the first surface 70. The receive filter 62 at least partially overlaps with the transmit filter 60 in plan view, and is electrically connected to the receive pad Pr1. In such a structure, the ground pattern 37 is located between the receive pad Pr1 and the transmit filter 60 in the first surface 70. As described above, the ground pattern 37 separates the receive pad Pr1 and the transmit filter 60. Accordingly, the capacitive coupling between the transmit filter 60 and the receive pad Pr1 in the first surface 70 can be inhibited, and the isolation characteristic between the transmit filter 60 and the receive filter 62 can be improved.

Moreover, the transmit terminal Tx (a first signal terminal) is electrically connected to the transmit filter 60. The receive terminal Rx (a second signal terminal) is electrically connected to the receive filter 62 through the receive pad Pr1. The ground terminal Gnd is electrically connected to the ground pattern 37. The substrate 20 (a second substrate) is mounted above the first surface 70 of the substrate 10. The receive filter 62 is located on the second surface 72 of the substrate 20. The transmit terminal Tx, the receive terminal Rx, and the ground terminal Gnd are located on the third surface 74 that is an opposite surface of the substrate 10 from the first surface 70. In such a structure, the receive pad Pr1 is located on the first surface 70 of the substrate 10. Thus, the isolation characteristic between the transmit filter 60 and the receive filter 62 deteriorates. Thus, the provision of the ground pattern 37 can improve the isolation characteristic.

Furthermore, the substrate 20 is mounted above the first surface 70 so that the second surface 72 and the first surface 70 face each other, and the receive filter 62 is electrically connected to the receive pad Pr1 through the bump 36. In such a structure, the isolation characteristic between the transmit filter 60 and the receive filter 62 deteriorates. Accordingly, the provision of the ground pattern 37 can improve the isolation characteristic.

Furthermore, the via wiring 32a (a first via wiring) penetrates through the substrate 10, and electrically connects the transmit filter 60 and the transmit terminal Tx. The via wiring 32b (a second via wiring) penetrates through the substrate 10, and electrically connects the receive pad Pr1 and the receive terminal Rx.

Furthermore, the ring-shaped sealing portion 38 is located on the substrate 10 so as to surround the transmit filter 60, the receive pad Pr1, and the ground pattern 37, and seals the transmit filter 60 and the receive filter 62 in the air gap 26.

Furthermore, the ground pattern 37 is preferably electrically separated from the transmit filter 60 in the first surface 70. This structure can inhibit the interference between the transmit filter 60 and the receive pad Pr1 through the ground pattern 37. Therefore, the isolation characteristic between the transmit filter 60 and the receive filter 62 can be further improved.

The film thickness of the ground pattern 37 is preferably equal to or greater than the film thickness of the pad 35b. This structure can further inhibit the capacitive coupling between the pad 35b and the transmit filter 60. As illustrated in FIG. 1, the pad 35b includes the metal layer 18 for bonding the bump 36. Thus, even when a wiring line interconnecting the acoustic wave resonators 12 is formed of the metal layer 17, the pad 35b becomes thicker than the wiring line interconnecting the acoustic wave resonators 12. At this time, the ground pattern 37 is preferably formed of the metal layers 17 and 18. This structure allows the ground pattern 37 and the pad 35b to have approximately the same film thickness. Therefore, the capacitive coupling between the pad 35b and the transmit filter 60 can be further inhibited.

Since the via wiring 32 is formed by processing the substrate 10, a fine crack may exist. Thus, the crack may expand because of the stress or the like caused by the stress and/or the temperature change at the time of bonding the bumps 36. As illustrated in FIG. 1 and FIG. 3, the via wiring 32 and the bump 36 coupled to the same pad 35 do not overlap in plan view. Accordingly, the expanding of a crack due to the stress caused by the stress and/or the temperature change at the time of bonding the bumps 36 can be inhibited.

Figure 8:
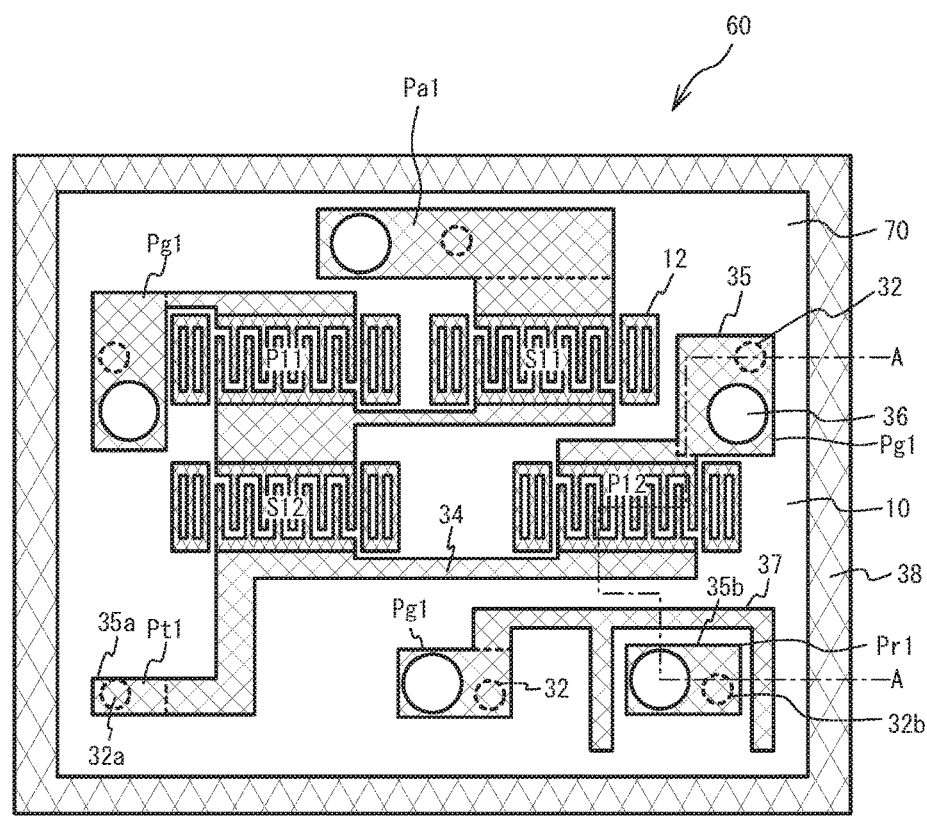
FIG. 8 is a plan view of the upper surface of the substrate 10 in a first variation of the first embodiment.

FIG. 8 is a plan view of the upper surface of the substrate 10 in a first variation of the first embodiment. As illustrated in FIG. 8, the ground pattern 37 surrounds three sides of the receive pad Pr1 in the first surface 70, but does not surround one side of the receive pad Pr1. Other structures are the same as those of the first embodiment, and the description thereof is thus omitted.

Figure 9:
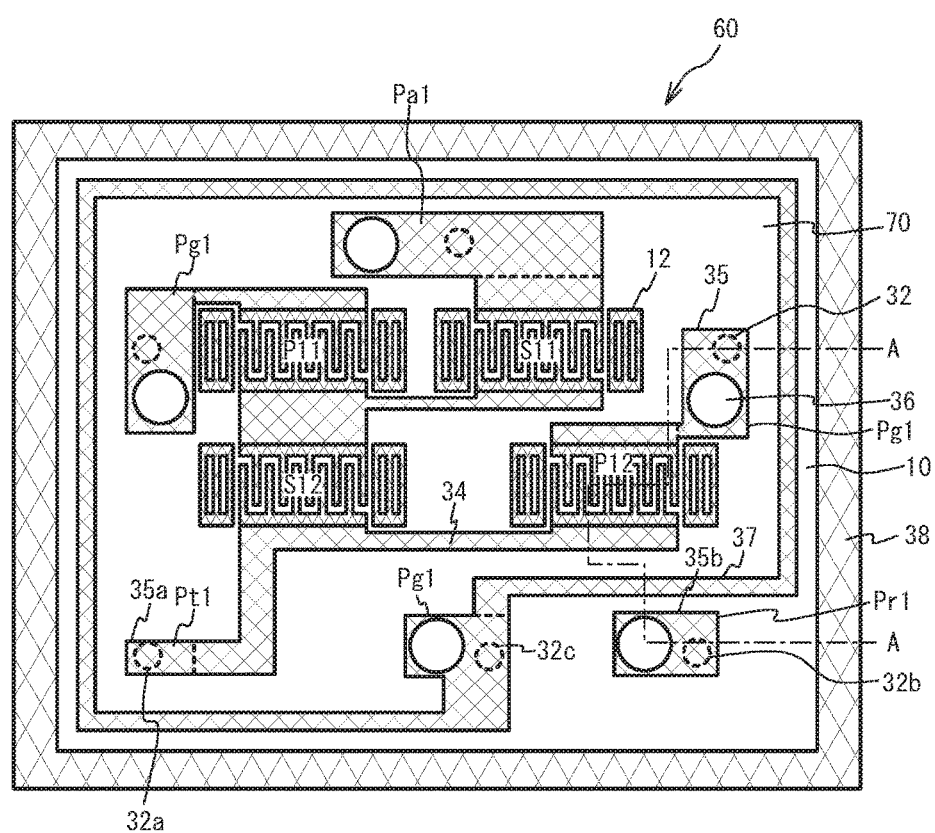
FIG. 9 is a plan view of the upper surface of the substrate 10 in a second variation of the first embodiment.

FIG. 9 is a plan view of the upper surface of the substrate 10 in a second variation of the first embodiment. As illustrated in FIG. 9, the ground pattern 37 surrounds the transmit filter 60 in the first surface 70. Other structures are the same as those of the first embodiment, and the description thereof is thus omitted.

It is only required that the ground pattern 37 is located between the transmit filter 60 and the receive pad Pr1. The ground pattern 37 is preferably located so as to block all the lines connecting, for example, the transmit filter 60 and the receive pad Pr1. As described in the first embodiment and the first variation thereof, the ground pattern 37 preferably surrounds the receive pad Pr1 in the first surface 70. This structure can further improve the isolation characteristic between the transmit filter 60 and the receive filter 62. As described in the first embodiment, the ground pattern 37 preferably completely surrounds the receive pad Pr1 in the first surface 70. As described in the second variation of the first embodiment, the ground pattern 37 may completely surround the transmit filter 60 in the first surface 70.

The first embodiment has described a duplexer as an example, but a filter located on the substrate 10 and a filter located on the substrate 20 may not necessarily be interconnected. An exemplary case where the receive filter 62 and the transmit filter 60 are ladder-type filters has been described, but at least one of the receive filter 62 and the transmit filter 60 may be a multimode type filter. A receive filter may be located on the first surface 70, and a transmit filter may be located on the second surface 72. An exemplary case where the acoustic wave resonator 12 is an surface acoustic wave resonator and the acoustic wave resonator 22 is a piezoelectric thin film resonator has been described, but the acoustic wave resonators 12 and 22 may be any one of the surface acoustic wave resonator and the piezoelectric thin film resonator. An exemplary case where the piezoelectric substrate 10b is bonded to the support substrate 10a, but the support substrate may not necessarily be provided.

The transmit filter 60 and the receive filter 62 have been described as examples, but filters located on the substrate 10 and the substrate 20 may not be necessarily a transmit filter or a receive filter, and may be filters each being connected between the input terminal and the output terminal. For example, the transmit band and the receive band of the Frequency Division Duplex (FDD) system do not overlap. As described above, when filters have different passbands (for example, when the center frequencies of the passbands differ from each other, or when the passbands do not overlap), the isolation characteristic between the filters is important. Therefore, the provision of the ground pattern is preferable.

Second Embodiment

Figure 10:
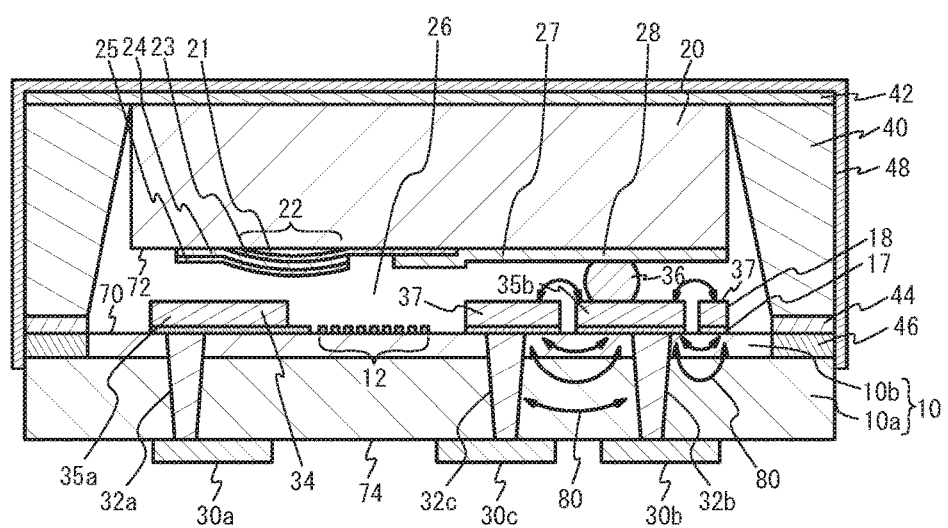
FIG. 10 is a cross-sectional view of an acoustic wave device in accordance with a second embodiment.

FIG. 10 is a cross-sectional view of an acoustic wave device in accordance with a second embodiment. As illustrated in FIG. 10, in the edge portion of the substrate 10, the piezoelectric substrate 10b is removed, and a ring-shaped metal layer 46 is formed. A ring-shaped electrode 44 is located on the ring-shaped metal layer 46. A ring-shaped sealing portion 40 is located on the ring-shaped electrode 44. The ring-shaped sealing portion 40 surrounds the substrate 20. A flat plate-like lid 42 is located on the upper surface of the substrate 20 and the upper surface of the ring-shaped sealing portion 40. A protective film 48 is formed so as to cover the ring-shaped metal layer 46, the ring-shaped electrode 44, the ring-shaped sealing portion 40, and the lid 42. The ring-shaped sealing portion 40 is formed of, for example, a metal layer such as a solder layer or an insulating layer such as a resin layer. The ring-shaped metal layer 46 is a copper layer or a gold layer, and the ring-shaped electrode 44 is formed of a metal layer such as a nickel layer. The lid 42 is made of, for example, a metal plate or an insulating plate. The protective film 48 is a metal film or an insulating film.

Figure 11:
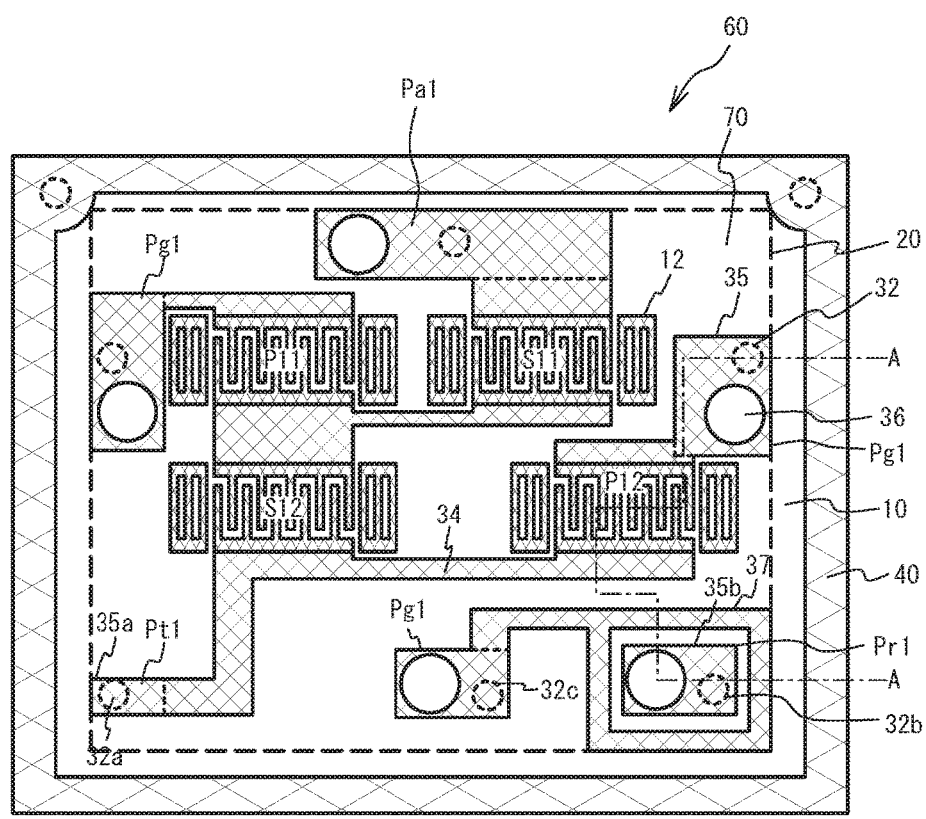
FIG. 11 is a plan view of the upper surface of the substrate 10 in the second embodiment.
Figure 12:
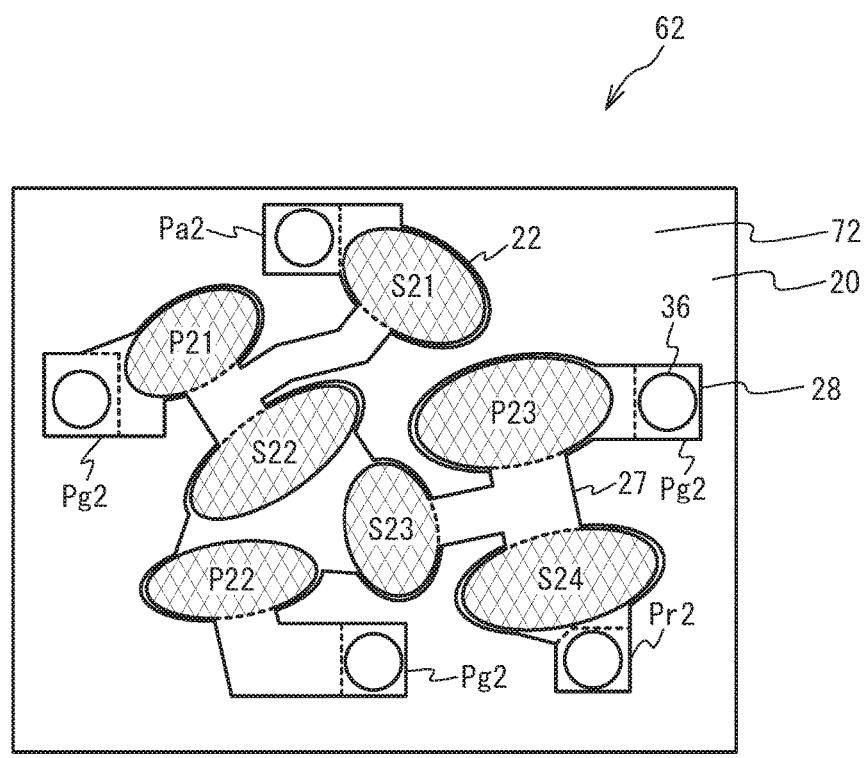
FIG. 12 is a plan view of the lower surface of the substrate 20 in the second embodiment.

FIG. 11 is a plan view of the upper surface of the substrate 10 in the second embodiment. FIG. 12 is a plan view of the lower surface of the substrate 20 in the second embodiment. The substrate 20 is smaller than the substrate 10 in plan view. The ring-shaped sealing portion 40 is formed so as to surround the substrate 20. The ring-shaped sealing portion 40 is electrically connected to the ground terminal Gnd through the via wiring 32. Other structures are the same as those of the first embodiment, and the description thereof is omitted.

Figure 13A:
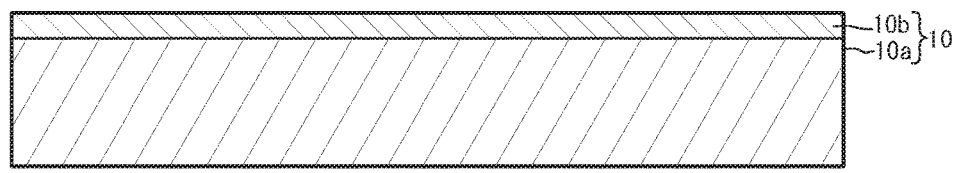
FIG. 13A through FIG. 13D are cross-sectional views (No. 1) illustrating a method of fabricating the acoustic wave device in accordance with the second embodiment.

FIG. 13A through FIG. 15C are cross-sectional views illustrating a method of fabricating the acoustic wave device in accordance with the second embodiment. As illustrated in FIG. 13A, the lower surface of the piezoelectric substrate 10b is bonded onto the upper surface of the support substrate 10a. This bonding is performed in a wafer state. This bonding may be performed by activating the upper surface of the support substrate 10a and the lower surface of the piezoelectric substrate 10b and then bonding them at normal temperature, or by bonding them with an adhesive agent.

Figure 13B:
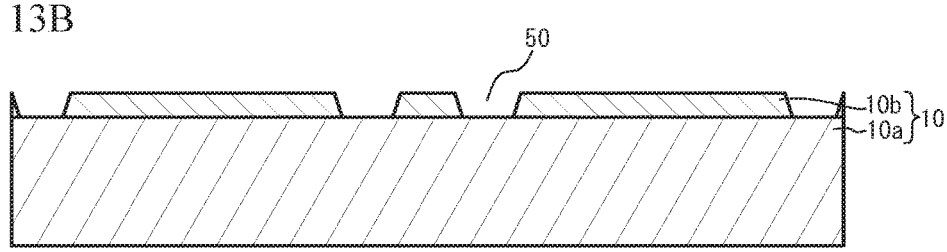

As illustrated in FIG. 13B, desired apertures 50 are formed in the piezoelectric substrate 10b. The apertures 50 are formed by, for example, blasting using a patterned photoresist as a mask. The apertures 50 may be formed by ion milling or wet etching instead of blasting.

Figure 13C:
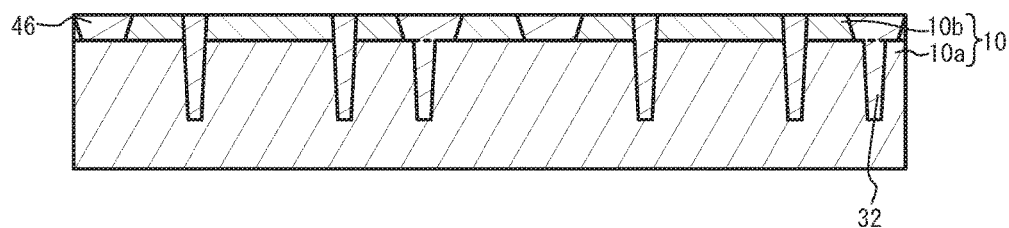

As illustrated in FIG. 13C, via holes are formed in the piezoelectric substrate 10b and the support substrate 10a. The via holes are formed by, for example, irradiating the piezoelectric substrate 10b and the support substrate 10a with a laser beam. A seed layer (not illustrated) is formed in the via holes and the apertures 50. An electric current is supplied to the seed layer, and the via wirings 32 are formed in the via holes and the ring-shaped metal layer 46 is formed in the apertures 50 by electrolytic plating. When the via wirings 32 and the ring-shaped metal layer 46 are made of a copper layer, the seed layer may be made of, for example, a titanium film with a film thickness of 100 μm and a copper layer with a film thickness of 200 μm stacked in this order from the substrate 10 side. Unnecessary plated layers are removed by Chemical Mechanical Polishing (CMP) or the like.

Figure 13D:
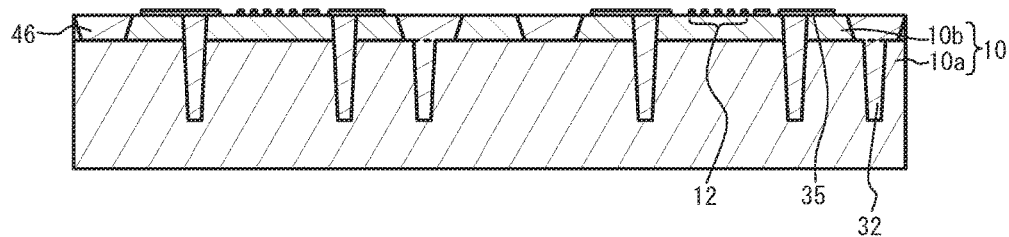

As illustrated in FIG. 13D, formed on the upper surface of the piezoelectric substrate 10*b* are the acoustic wave resonators 12, the wiring lines 34, and the pads 35. The acoustic wave resonator 12 is made of, for example, a titanium film and an aluminum film stacked in this order from the substrate 10 side. The wiring line 34 and the pad 35 are made of, for example, a titanium film and a gold film stacked in this order from the substrate 10 side.

Figure 14A:
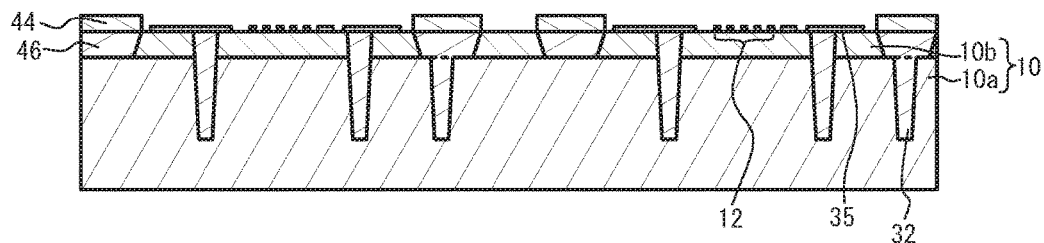
FIG. 14A through FIG. 14D are cross-sectional views (No. 2) illustrating the method of fabricating the acoustic wave device in accordance with the second embodiment.
Figure 14B:
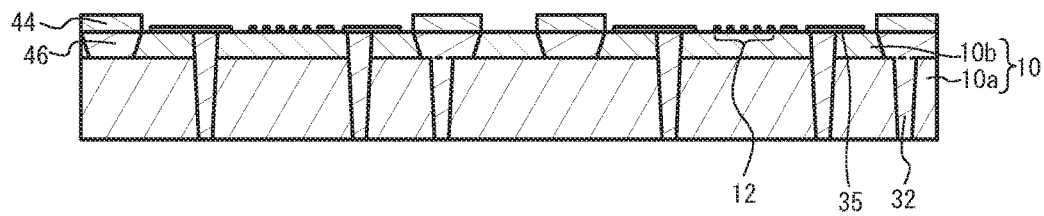

As illustrated in FIG. 14A, the ring-shaped electrodes 44 are formed on the ring-shaped metal layer 46. The ring-shaped electrode 44 is formed of, for example, a titanium film and a nickel film stacked in this order from the substrate 10 side, and is formed by evaporation and liftoff. As illustrated in FIG. 14B, the lower surface of the substrate 10 is polished or ground. This process exposes the via wirings 32 from the lower surface of the substrate 10.

Figure 14C:
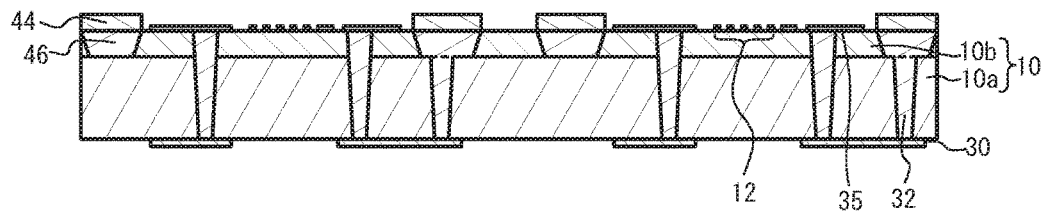

As illustrated in FIG. 14C, the terminals 30 are formed so as to make contact with the via wirings 32. For example, a seed layer is formed on the lower surface of the substrate 10. A photoresist including apertures is formed under the seed layer. An electric current is supplied to the seed layer, and a plated layer is formed in the apertures by electrolytic plating. Then, the seed layer other than the plated layer is removed. The seed layer may be formed of, for example, a titanium film and a copper film stacked in this order from the substrate 10 side. The plated layer may be formed of, for example, a copper layer, a nickel layer, and a gold layer stacked in this order from the substrate 10 side.

Figure 14D:
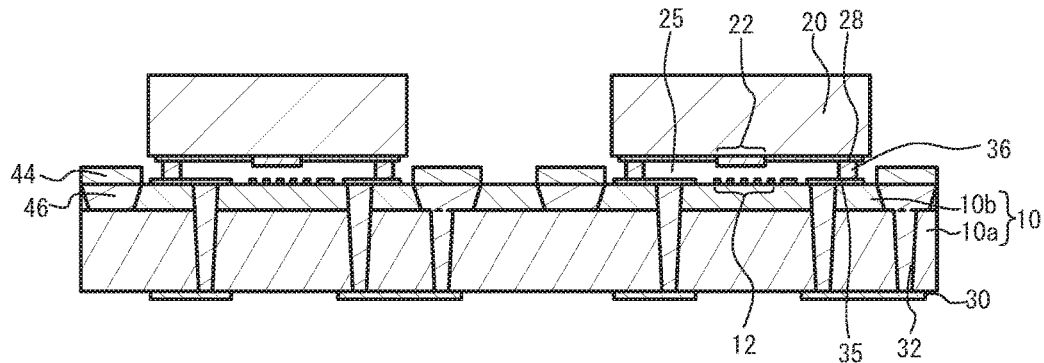

As illustrated in FIG. 14D, the substrate 20 is flip-chip mounted on the substrate 10. The substrate 20 is a chip after the separation into individual chips, and gold stud bumps as the bumps 36 are formed on the lower surface of the substrate 20.

Figure 15A:
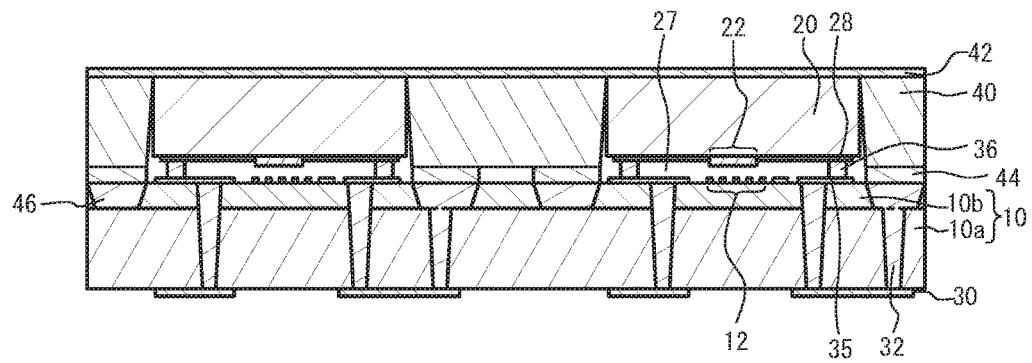
FIG. 15A through FIG. 15C are cross-sectional views (No. 3) illustrating the method of fabricating the acoustic wave device in accordance with the second embodiment.

As illustrated in FIG. 15A, a solder plate is placed above the substrate 10 so as to cover the substrate 20. The lid 42 is placed on the solder plate. The solder plate is pressed to the substrate 10 by the lid 42, and the lid 42 is heated to a temperature equal to or greater than the melting point of the solder plate. This process melts the solder plate, forming the ring-shaped sealing portion 40. The upper surface of the ring-shaped electrode 44 has a good solderability, and thus, the ring-shaped sealing portion 40 is bonded to the substrate 10 through the ring-shaped electrode 44. The surface of the substrate 20 has a poor solderability, and thus the ring-shaped sealing portion 40 is not bonded to the side surface of the substrate 20 even when making contact with the side surface of the substrate 20. The lid 42 has a good solderability, and thus the ring-shaped sealing portion 40 is bonded to the lid 42. The lid 42 makes contact with the upper surface of the substrate 20, but is not bonded to the upper surface of the substrate 20.

Figure 15B:
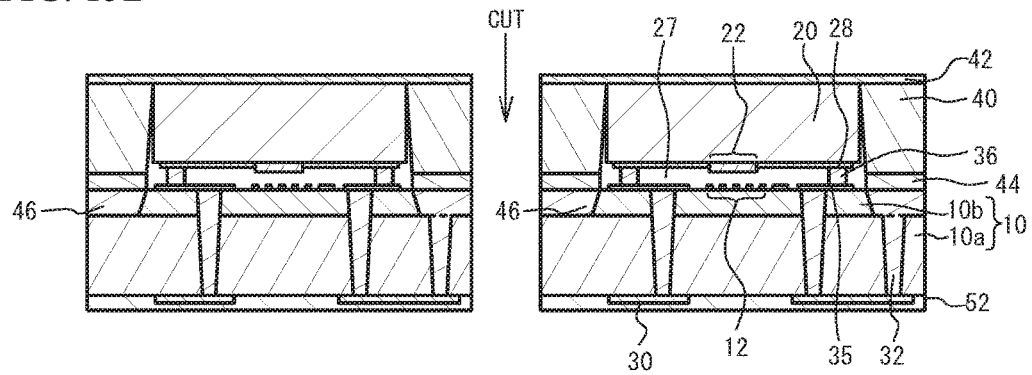
Figure 15C:
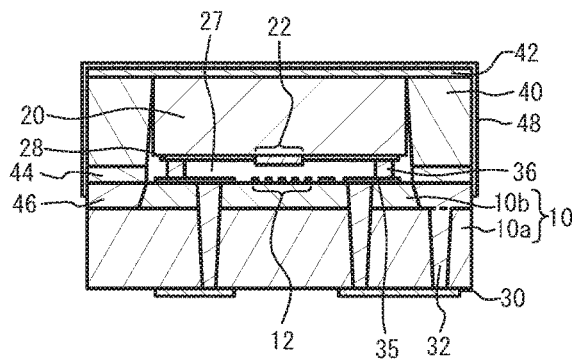

As illustrated in FIG. 15B, the lower surface of the substrate 10 is protected by a protective material 52 such as a photoresist. The lid 42, the ring-shaped sealing portion 40, and the substrate 10 are cut by dicing. As illustrated in FIG. 15C, the protective film 48 is formed so as to cover the side surface of the ring-shaped sealing portion 40. The protective film 48 is formed by, for example, barrel plating.

As described in the second embodiment, the ring-shaped sealing portion 40 may be formed on the substrate 10 so as to surround the substrate 20.

Figure 16:
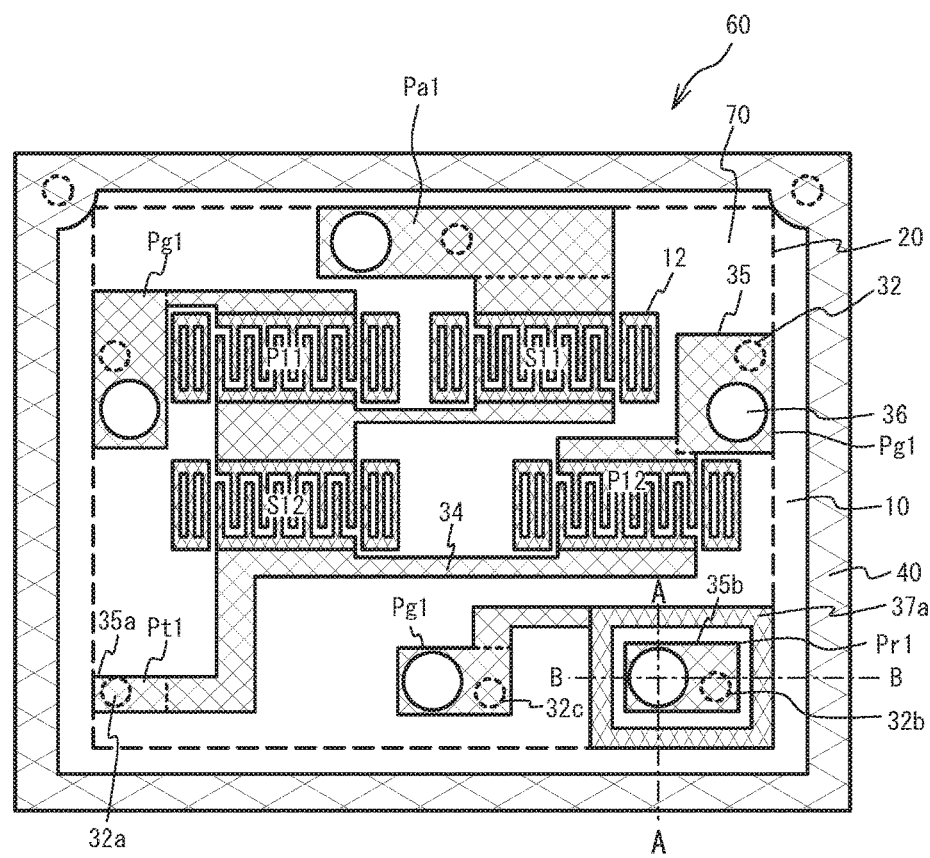
FIG. 16 is a plan view of the upper surface of the substrate 10 in the first variation of the second embodiment.
Figure 17:
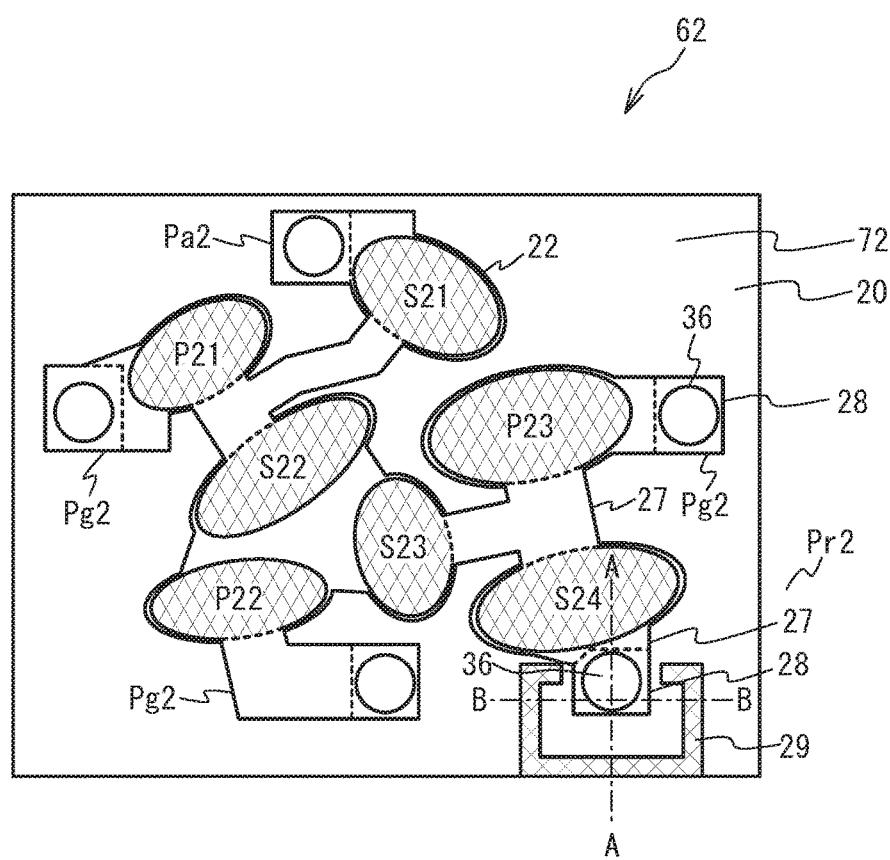
FIG. 17 is a plan view of the lower surface of the substrate 20 in the second variation of the second embodiment.
Figure 18A:
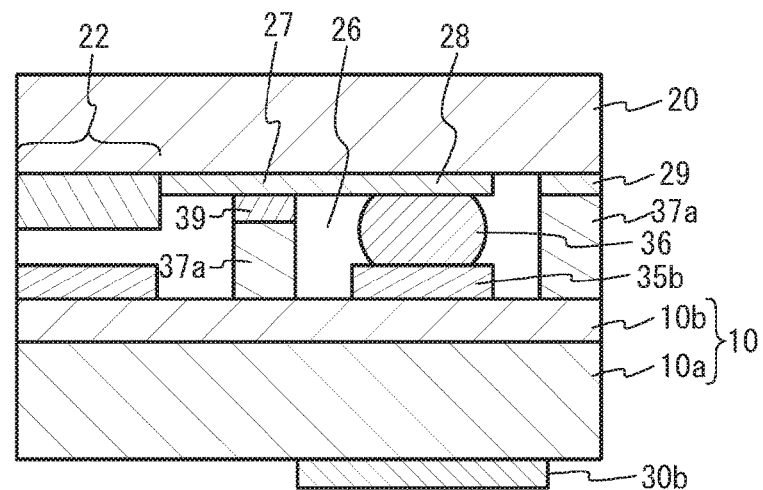
FIG. 18A is a cross-sectional view taken along line A-A in FIG. 16 and FIG. 17.
Figure 18B:
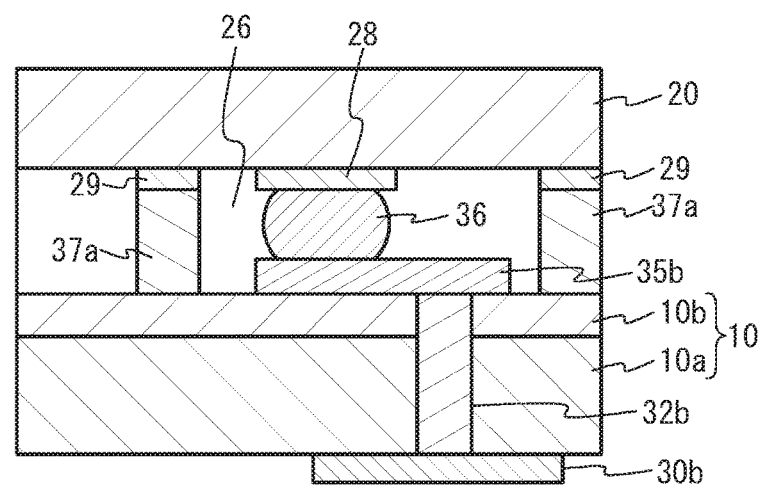
FIG. 18B is a cross-sectional view taken along line B-B in FIG. 16 and FIG. 17.

FIG. 16 is a plan view of the upper surface of the substrate 10 in a first variation of the second embodiment. FIG. 17 is a plan view of the lower surface of the substrate 20 in a second variation of the second embodiment. FIG. 18A is a cross-sectional view taken along line A-A in FIG. 16 and FIG. 17, and FIG. 18B is a cross-sectional view taken along line B-B in FIG. 16 and FIG. 17.

As illustrated in FIG. 16 through FIG. 18B, a ground pattern 37*a* located on the upper surface of the substrate 10 is bonded to a pattern 29 formed on the lower surface of the substrate 20. As illustrated in FIG. 16, the ground pattern 37*a* surrounds the pad 35*b*. As illustrated in FIG. 17, the pattern 29 surrounds the pad 28 in three directions. The wiring line 27 connecting the pad 28 and the acoustic wave resonator 22 is not electrically connected to the ground pattern 37*a*. As illustrated in FIG. 18A, an insulating layer 39 is located between the ground pattern 37*a* and the wiring line 27. The ground pattern 37*a* and the pattern 29 are formed of, for example, a metal layer such as a copper layer, an aluminum layer, or a gold layer. The ground pattern 37*a* is formed by, for example, plating. The pattern 29 is formed at the same time as, for example, the wiring line 27 and the pad 28. The insulating layer 39 is formed of, for example, a silicon oxide film or a resin film. The insulating layer 39 electrically separates the ground pattern 37*a* and the wiring line 27. Other structures are the same as those of the second embodiment, and the description thereof is omitted.

As described in the first variation of the second embodiment, the ground pattern 37*a* may be formed in an area from the substrate 10 to the substrate 20. This structure can inhibit the capacitive coupling between the transmit filter 60 and the receive pad Pr1 through the air gap 26. Thus, the isolation characteristic can be further improved.

Also in the first embodiment and the first variation of the embodiment, the ground pattern 37*a* may be formed.

Third Embodiment

Figure 19A:
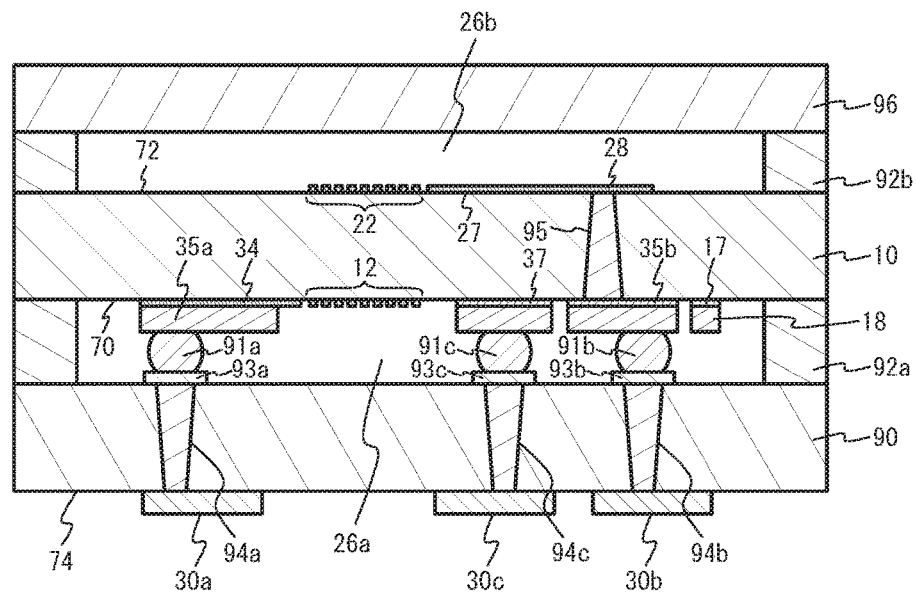
FIG. 19A and FIG. 19B are cross-sectional views of acoustic wave devices in accordance with a third embodiment and a first variation of the third embodiment, respectively.
Figure 19B:
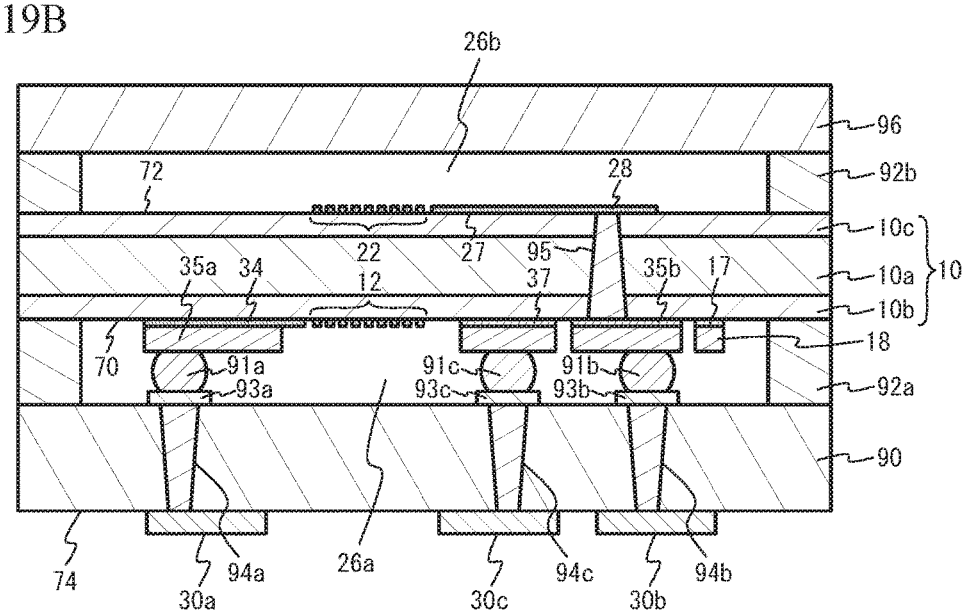

FIG. 19A and FIG. 19B are cross-sectional views of acoustic wave devices in accordance with a third embodiment and a first variation of the third embodiment, respectively. As illustrated in FIG. 19A, the substrate 10 is mounted on a mounting board 90. The upper surface and the lower surface of the substrate 10 correspond to the first surface 70 and the second surface 72, respectively. The lower surface of the mounting board 90 corresponds to the third surface 74. The mounting board 90 is made of an insulating layer such as, for example, ceramic or resin. Terminals 30*a* through 30*c* are located on the lower surface of the mounting board 90. Pads 93*a* through 93*c* are located on the upper surface of the mounting board 90. Via wirings 94*a* through 94*c* penetrating through the mounting board 90 are formed. The via wirings 94*a* through 94*c* electrically connect the terminals 30*a* through 30*c* to the pads 93*a* through 93*c*, respectively.

The substrate 10 is a piezoelectric substrate. Formed on the lower surface of the substrate 10 are the acoustic wave resonator 12, the wiring lines 34, the pads 35*a* and 35*b*, and the ground pattern 37. Formed on the upper surface of the substrate 10 are the acoustic wave resonator 22, the wiring lines 27, and the pads 28, and a via wiring 95 penetrating through the substrate 10 is formed. The via wiring 95 electrically connects the pad 28 and the pad 35*b*. The pads 35*a* and 35*b* and the ground pattern 37 are bonded to the pads 93*a* through 93*c* through bumps 91*a* through 91*c*, respectively. A ring-shaped sealing portion 92*a* is located between the mounting board 90 and the substrate 10, and seals the acoustic wave resonator 12 in an air gap 26*a*. A ring-shaped sealing portion 92*b* is located between the substrate 10 and a lid 96, and seals the acoustic wave resonator 22 in an air gap 26b.

The terminal 30a is electrically connected to the acoustic wave resonator 12 through the via wiring 94a, the pad 93a, the bump 91a, the pad 35a, and the wiring line 34. The terminal 30b is electrically connected to the acoustic wave resonator 22 through the via wiring 94b, the pad 93b, the bump 91b, the pad 35b, the via wiring 95, the pad 28, and the wiring line 27. The terminal 30c is electrically connected to the ground pattern 37 through the via wiring 94c, the pad 93c, and the bump 91c. Other structures are the same as those of the first embodiment, and the description thereof is omitted.

As illustrated in FIG. 19B, the substrate 10 includes the support substrate 10a, the piezoelectric substrate 10b bonded to the lower surface of the support substrate 10a, and the piezoelectric substrate 10c bonded to the upper surface of the support substrate 10a. The acoustic wave resonators 12 and 22 are respectively located on the piezoelectric substrates 10b and 10c. Other structures are the same as those of the third embodiment, and the description thereof is thus omitted.

In the third embodiment and the variations thereof, the mounting board 90 (a second substrate) includes the third surface 74 on which the transmit terminal Tx, the receive terminal Rx, and the ground terminal Gnd are located. The substrate 10 (a first substrate) is mounted on the mounting board 90, and includes the first surface 70 and the second surface 72 that are opposing surfaces. In addition, the substrate 10 is mounted on the mounting board 90 so that the first surface 70 faces the surface opposite from the third surface 74. In such a structure, the pad 35b coupled to the acoustic wave resonator 22 is formed on the first surface 70 of the substrate 10. Thus, the isolation characteristic between the transmit filter 60 and the receive filter 62 deteriorates. Therefore, the isolation characteristic can be improved by providing the ground pattern 37.

Fourth Embodiment

Figure 20A:
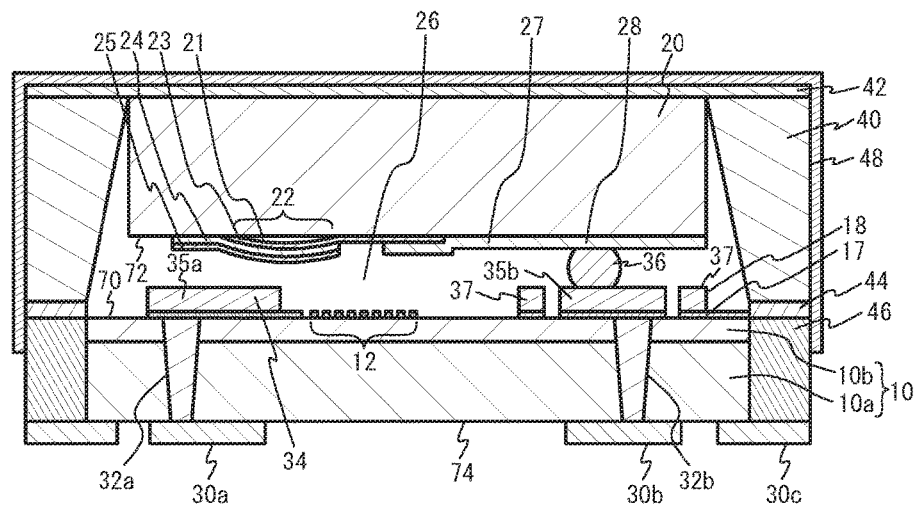
FIG. 20A and FIG. 20B are cross-sectional views of acoustic wave devices in accordance with a fourth embodiment and a first variation of the fourth embodiment, respectively.
Figure 20B:
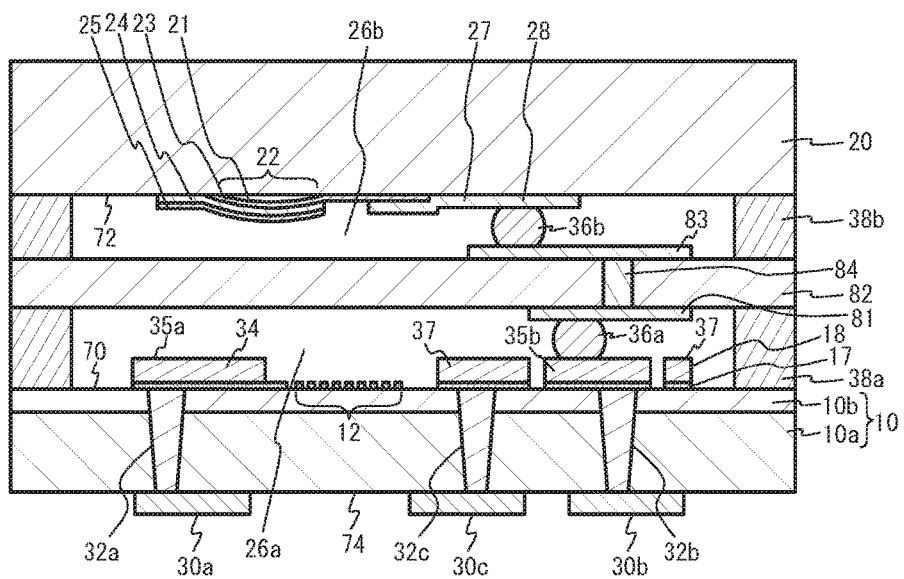

FIG. 20A and FIG. 20B are cross-sectional views of acoustic wave devices in accordance with a fourth embodiment and a first variation of the fourth embodiment, respectively. As illustrated in FIG. 20A, the ring-shaped metal layer 46 is located on the side surface of the substrate 10, and is coupled to the terminal 30a. The terminal 30c is coupled to the ground pattern 37 through the ring-shaped metal layer 46 and the ring-shaped electrode 44. Other structures are the same as those of the second embodiment, and the description thereof is thus omitted. As described in the fourth embodiment, the ground pattern 37 may be coupled to a ground through the ring-shaped metal layer 46.

As illustrated in FIG. 20B, a substrate 82 is located between the substrate 10 and the substrate 20. Pads 81 are located on the lower surface of the substrate 82. Pads 83 are located on the upper surface of the substrate 82. Via wirings 84 penetrating through the substrate 82 and electrically connecting the pads 81 and 83 are formed. The pads 35b and 81 are bonded together by a bump 36a. The acoustic wave resonator 12 is sealed in the air gap 26a by a ring-shaped sealing portion 38a located between the substrates 10 and 82. The pads 83 and 28 are bonded together by a bump 36b. The acoustic wave resonator 22 is sealed in the air gap 26b by a ring-shaped sealing portion 38b located between the substrates 20 and 82. The terminal 30b is electrically connected to the acoustic wave resonator 22 through the via wiring 32b, the pad 35b, the bump 36a, the pad 81, the via wiring 84, the pad 83, the bump 36b, the pad 28, and the wiring line 27. Other structures are the same as those of the first embodiment, and the description thereof is omitted.

As described in the first variation of the fourth embodiment, the substrate 82 may be located between the first surface 70 and the second surface 72.

Fifth Embodiment

Figure 21:
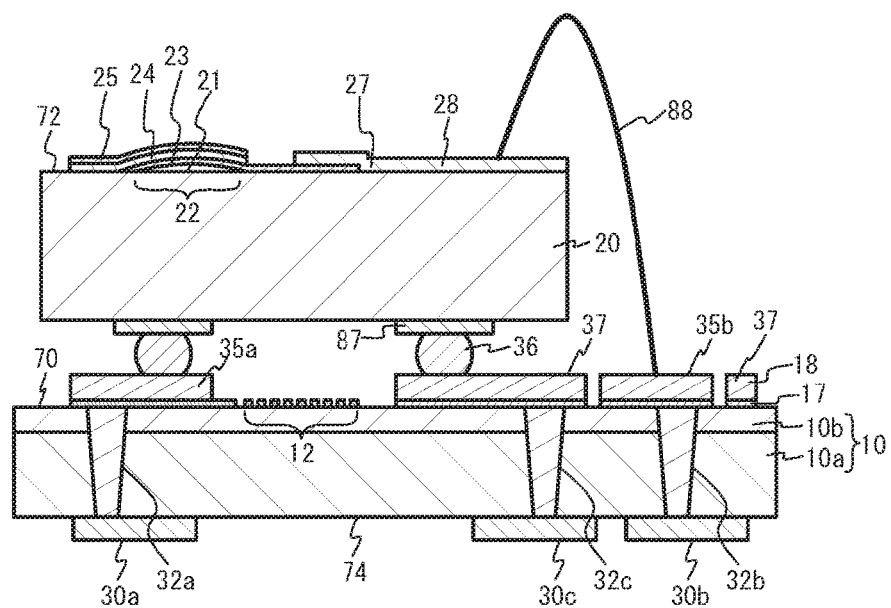
FIG. 21 is a cross-sectional view of an acoustic wave device in accordance with a fifth embodiment.

FIG. 21 is a cross-sectional view of an acoustic wave device in accordance with a fifth embodiment. As illustrated in FIG. 21, the substrate 20 is mounted on the substrate 10 so that the second surface 72 faces upward. Pads 87 are located on the lower surface of the substrate 20. The bump 36 is bonded to the pad 87, and is bonded to the pad 35a and the ground pattern 37. The bump 36 mechanically supports the substrate 20. The pads 35b and 28 are electrically connected through a bonding wire 88. Other structures are the same as those of the first embodiment, and the description thereof is omitted.

In the fifth embodiment, the substrate 20 is mounted above the first surface 70 so that the surface opposite from the second surface 72 faces the first surface 70. Even such a structure can improve the isolation characteristic by providing the ground pattern 37.

Although the embodiments of the present invention have been described in detail, it is to be understood that the various change, substitutions, and alterations could be made hereto without departing from the spirit and scope of the invention.

What is claimed is:

1. An acoustic wave device comprising:
   a first substrate;
   a first acoustic wave filter located on a first surface of the first substrate;
   a pad that is located on the first surface and electrically separated from the first acoustic wave filter in the first surface;
   a ground pattern that is located on the first surface, and is located between the pad and the first acoustic wave filter in the first surface; and
   a second acoustic wave filter that is electrically connected to the pad, and at least partially overlaps with the first acoustic wave filter in plan view.

2. The acoustic wave device according to claim 1, further comprising:
   a first signal terminal that is located on a third surface, which is an opposite surface of the first substrate from the first surface, and is electrically connected to the first acoustic wave filter;
   a second signal terminal that is located on the third surface, and is electrically connected to the second acoustic wave filter through the pad;
   a ground terminal that is located on the third surface, and is electrically connected to the ground pattern; and
   a second substrate that is mounted above the first surface of the first substrate, wherein
   the second acoustic wave filter is located on a second surface of the second substrate.

3. The acoustic wave device according to claim 2, wherein
   the second substrate is mounted above the first surface so that the second surface faces the first surface across an air gap, and
   the second acoustic wave filter and the pad are electrically connected through a bump.

4. The acoustic wave device according to claim 3, further comprising a sealing portion that is located on the first substrate so as to surround the first acoustic wave filter, the pad, and the ground pattern, and seals the first acoustic wave filter and the second acoustic wave filter in the air gap.

5. The acoustic wave device according to claim 2, wherein the second substrate is mounted above the first surface so that an opposite surface of the second substrate from the second surface faces the first surface.

6. The acoustic wave device according to claim 2, further comprising:
- a first via wiring that penetrates through the first substrate, and electrically connects the first acoustic wave filter and the first signal terminal; and
- a second via wiring that penetrates through the first substrate, and electrically connects the pad and the second signal terminal.

7. The acoustic wave device according to claim 1, further comprising:
- a second substrate including a third surface;
- a first signal terminal that is located on the third surface, and is electrically connected to the first acoustic wave filter;
- a second signal terminal that is located on the third surface, and is electrically connected to the second acoustic wave filter through the pad; and
- a ground terminal that is located on the third surface, and is electrically connected to the ground pattern, wherein the first substrate is mounted above the second substrate, and the second acoustic wave filter is located on a second surface that is an opposite surface of the first substrate from the first surface.

8. The acoustic wave device according to claim 7, wherein the first substrate is mounted above the second substrate so that the first surface faces an opposite surface of the second substrate from the third surface.

9. The acoustic wave device according to claim 1, wherein the ground pattern surrounds the pad on the first surface.

10. The acoustic wave device according to claim 1, wherein the ground pattern electrically separates from the first acoustic wave filter on the first surface.

11. The acoustic wave device according to claim 2, wherein
- one of the first acoustic wave filter and the second acoustic wave filter is a transmit filter connected between a common terminal and a transmit terminal,
- another one of the first acoustic wave filter and the second acoustic wave filter is a receive filter connected between the common terminal and a receive terminal,
- the first signal terminal is one of the transmit terminal and the receive terminal, and
- the second signal terminal is another one of the transmit terminal and the receive terminal.

12. The acoustic wave device according to claim 1, wherein the first acoustic wave filter and the second acoustic wave filter have different passbands.

* * * * *